United States Patent [19]
Jurisich

[11] Patent Number: 5,283,949
[45] Date of Patent: Feb. 8, 1994

[54] METHOD OF PRODUCING A PRINTED CIRCUIT BOARD HAVING A CONDUCTIVE PATTERN THEREON

[76] Inventor: Peter L. Jurisich, 26232 Tierra Cir., Mission Viejo, Calif. 92691

[21] Appl. No.: 971,079

[22] Filed: Nov. 3, 1992

[51] Int. Cl.$^5$ ............................................. H05K 3/02
[52] U.S. Cl. ................................. 29/846; 156/261; 427/96
[58] Field of Search ................ 156/261; 29/846, 832, 29/848; 427/96

[56] References Cited

U.S. PATENT DOCUMENTS

| | | | |
|---|---|---|---|
| 2,772,501 | 12/1956 | Malcolm | 156/261 X |
| 3,990,142 | 11/1976 | Weglin | 156/261 X |
| 4,320,572 | 3/1982 | Brower et al. | 156/261 X |
| 4,325,771 | 4/1982 | Brower et al. | 29/832 X |
| 4,532,152 | 7/1985 | Elarde | 29/848 X |
| 4,614,837 | 9/1986 | Kane et al. | 29/846 X |
| 5,097,101 | 3/1992 | Trobough | 29/846 X |

FOREIGN PATENT DOCUMENTS

| | | | |
|---|---|---|---|
| 911064 | 9/1972 | Canada | 29/846 |
| 54-136693 | 10/1979 | Japan | 156/261 |

OTHER PUBLICATIONS

Research Disclosure Jul. 1988, No. 29144, p. 496.

*Primary Examiner*—Carl J. Arbes
*Attorney, Agent, or Firm*—Spensley Horn Jubas & Lubitz

[57] ABSTRACT

Methods of producing a printed circuit board having a desired conductive pattern thereon provide the upper surface of a substrate board with raised portions having trenches therebetween. The raised portions, which define a desired conductive pattern, are then treated to form conductors thereon. In a first method, the resin used in the laminant forming the substrate board includes a hard particulate filler such as glass beads that are exposed at the raised portions of the substrate surface following grinding. Conductive metal is then welded onto the exposed filler to form a desired conductive layer over the raised portions. In a second method, the resin of the laminant forming the substrate board includes conductive metallic powder, such that burnishing of the raised portions forms conductors at the raised portions. In a third method, a conductive layer is laminated to the upper surface of the substrate board using adhesive and hot pressing, following which the unbonded portions of the conductive layer at the trenches are removed, such as by shot peening. The remaining portions of the conductive layer form the desired conductive pattern.

11 Claims, 3 Drawing Sheets

METHOD OF PRODUCING A PRINTED CIRCUIT BOARD HAVING A CONDUCTIVE PATTERN THEREON

BACKGROUND OF THE INVENTION

1. Field or the Invention

The present invention relates to the production of printed circuit boards, and more particularly to methods for providing a desired conductive pattern on a substrate board.

2. Description of the Prior Art

The printed circuit board (hereinafter "PCB"), also known as a printed wiring board, has been the foundation of circuit packaging since as early as the 1940s. This well-established method of interconnecting and packaging a variety of electronic components is both space efficient and cost-effective. For those reasons, PCBs are widely used in, for example, computers, consumer electronics, military applications, and a number of other electronics products.

PCBs have many advantages over discrete wire connection of electronic components. For instance, when there is a call for high production of identical electronic components, PCBs have significant advantages. One reason is that, within a single production batch, the electronic components and their arrangement within the PCB are identical for each PCB. Fabrication therefore becomes repetitive and the assembly line may be wholly or partially automated. Also, quality control may be carefully monitored. Such automation and quality control advantages translate to significant cost savings. By contrast, hard wiring is labor intensive and prone to errors during assembly. Another reason PCBs are superior to hard wiring is that electronic components on a PCB can be packaged more densely, thereby reducing size and weight. Due to these advantages of PCBs, any improvements in the processing of PCBs are highly desirable.

A conventional PCB employs a laminate structure having one or more layers of conductive copper foil laminated onto a "substrate" board. The substrate board is itself typically a laminate, made from an electrical insulator such as paper, woven glass cloth, or thermosetting or thermoplastic polymer, which insulator is impregnated with resin. The resin-impregnated board, without the copper is commonly called a "prepreg," in the industry. The copper foil is laminated onto the "prepreg" to provide the conductive layer of the PCB which carries the electrical signals between the electronic components that are later mounted on the PCB. The desired circuit network is transferred onto the copper-clad board by etching the copper layer into the desired conductive pattern.

The two basic processes for creating the conductive pattern in the copper foil are screen printing and photo-printing. In either case, a stencil or template duplicating the desired circuit network is prepared ahead of time. In the screen printing process, liquid resist material is forced through the stencil to create an image of the desired circuit network on the copper foil layer. Then, the resist is cured and different chemicals are applied to strip away the copper not covered by the resist material. The balance of the copper that remains after stripping and curing becomes the circuit network. In the photo-printing process, the desired circuit network is photo-graphed onto a board after it has been coated with a light-sensitive photoresist material. After exposure to light, the circuit pattern in the photoresist material hardens and protects the copper thereunder from etching chemicals that are subsequently added. After passage of time, the chemicals dissolve the unexposed portions of the photoresist material along with the copper layer underneath. The remaining pattern formed in the copper layer is the current-carrying circuit. Conventional methods used to make a circuit network include combinations of these printing and etching methods, as well as plating.

In the final step, electronic components like transistors, resistors, diodes, etc. are soldered on to the board. Those electronic components have leads that pass through holes drilled in the board where they are then soldered (called the through-hold design). More recently, the components are commonly soldered directly onto the exposed copper cladding without use of drilled holes. This method is called Surface Mount Technology (SMT).

Although the conventional methods of manufacturing PCBs are quite versatile and highly evolved, there are a number of limitations and disadvantages. One disadvantage of patterning PCBs through chemical etching is that it is expensive due to the chemicals consumed and the sophisticated processes used. Also, it is inherently a multi-step and relatively slow process which significantly reduces PCB throughout. In addition, specially-equipped manufacturing facilities and highly-skilled technicians are required to support certain segments of such an operation. Furthermore, the toxicity of expended chemicals and their byproducts limits the efficacy of reclamation procedures. Indeed, concerns for the environment and the ecosystem make disposal of these toxic chemicals a nontrivial and costly task. Lastly, certain conductors are not well adapted to etching techniques. In particular, high temperature superconductors are difficult to chemically etch while retaining the desired superconductivity. For such superconductors, other patterning techniques must be devised.

Several improved methods of producing a printed circuit board are described in a co-pending application of Peter L. Jurisich, Ser. No. 07/552,774, which application was filed Jul. 16, 1990 and is entitled "Mechanical Method For Printed Circuit Board Patterning". Such co-pending application describes a method of fabricating a circuit network for a printed circuit board through mechanical embossment. A conductive layer is laminated onto an electrically insulating board, and simultaneously an impression of a desired circuit network is embossed into the conductive layer and board, creating high and low regions therein. Portions of the conductive layer situated in the high regions are then ground off, leaving the low regions which form the desired circuit network. In a second method described in the co-pending application, the embossment process is modified to shear the high regions away from the low regions The resulting circuit network is of that portion of the conductive layer situated in the high regions. In a third method described in the co-pending application, adhesive is deposited on the conductive layer in a pattern that is an image of the desired circuit network. The conductive layer is then laminated to the board. Portions of the conductive layer that are unbonded are then ground off, with the balance of the conductive layer being left behind to form the desired circuit network.

The methods described in co-pending application Ser. No. 07/552,774 are advantageous over various prior art techniques in producing printed circuit boards having desired conductive patterns thereon. However, it may be desirable for certain applications to provide alternative methods of fabrication. For example, rather than defining a desired conductive pattern on a conductive layer and then removing the remaining portions of such layer using various techniques, it may be advantageous to provide a surface of a substrate board or other portion of the printed circuit board with pattern defining portions that are then treated to form the conductive pattern. Such techniques may be advantageous from the standpoint of cost, ease of manufacture and the nature of the printed circuit board thereby produced.

SUMMARY OF THE INVENTION

Methods of producing a printed circuit board in accordance with the invention process a surface of a substrate board to provide the surface with raised portions defining a desired conductive pattern. The raised portions of the surface are then treated to form conductors thereon.

The processing of the surface of the substrate board may be carried out by hot pressing the surface of the substrate board with a plate having a network of recesses therein. The network of recesses in the plate provides the surface of the substrate board with a desired pattern of raised portions.

Treating of the raised portions of the surface of the substrate board to form conductors thereon may be carried out using a variety of techniques including the welding of conductive particles onto hard particulate at the raised portions of the surface of the substrate board, burnishing the raised portions of the surface of the substrate board to form conductors from conductive particulate filler therein, or laminating an adhesive coated conductive foil to the raised portions of the surface of the substrate board and then removing portions of the conductive foil between the raised portions of the surface.

In the particular steps of a first method according to the invention, a laminated substrate board is formed using a resin having a hard particulate filler therein. The hard particulate filler may comprise glass beads or particles of similar composition. The resin is provided with a sufficient quantity of the hard particulate filler so that the surface portions of the formed laminated substrate board have a relatively high concentration of the filler thereat. Following hot pressing or other processing to provide a surface of the substrate board with raised portions defining a desired conductive pattern, the raised portions are ground to expose the hard particulate filler. Conductive particles are then welded onto the exposed hard particulate filler at the raised portions of the surface to form conductors. The welding may be accomplished by repeatedly rubbing a solid mass of conductive metal such as a block of aluminum over the raised portions of the surface Alternatively, the welding may be accomplished by directing atomized aluminum onto the surface of the substrate board and passing a roller over the raised portions of the surface.

In the particular steps of a second method according to the invention, a laminated substrate board is formed using a resin having conductive particles therein The conductive particles may comprise aluminum powder or similar conductive metal particles. After hot pressing or other appropriate processing to provide a surface of the substrate board with raised portions defining a desired conductive pattern, such raised portions are burnished. The concentration of conductive particles in the resin of the substrate board is such that burnishing forms conductors from the particles at the raised portions of the surface.

In the particular steps of a third method according to the invention, a surface of a conductive foil is coated with adhesive and the foil is applied to the surface of a substrate board which has been processed to provide raised portions defining a desired conductive pattern. After lamination of the conductive foil onto the raised portions of the surface, the unbonded portions of the conductive foil between the raised portions of the surface are removed. Such removal can be accomplished using shot peening. Alternatively, the removal can be accomplished by rotating a roller over the conductive foil.

The printed circuit boards produced by the various methods described can be electroplated to improve the conductive matrix formed on the raised portions, where desired.

BRIEF DESCRIPTION OF THE DRAWINGS

The foregoing and other objects, features and advantages of the invention will be apparent from the following more particular description of preferred embodiments of the invention, as illustrated in the accompanying drawings, in which.

DETAILED DESCRIPTION OF THE INVENTION

Figure 1:
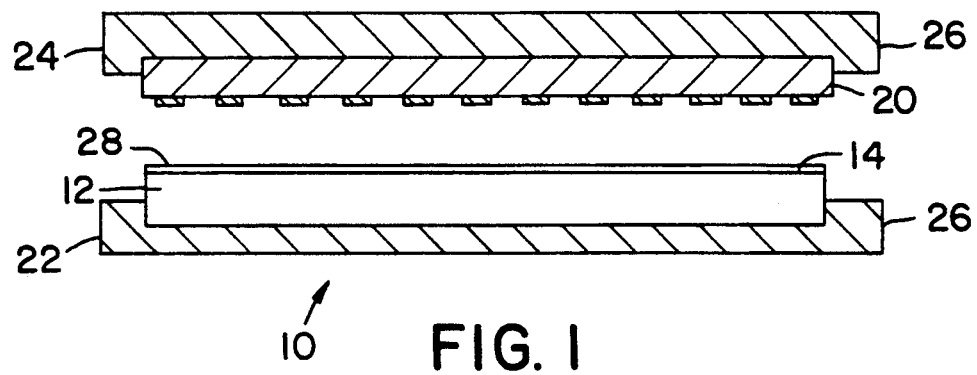
FIG. 1 illustrates apparatus employed in forming a substrate board used in processes according to the invention.

FIG. 1 illustrates apparatus 10 for forming a substrate board 12 used in methods according to the invention. Although the substrate board 12 can comprise other compositions, in the present example the board 12 comprises a plastic laminant made of fiberglass-reinforced plastic or fabric-reinforced plastic. An appropriate resin system is used to form the laminant. Such resin system may comprise epoxy resin or other appropriate resin types.

Figure 2:
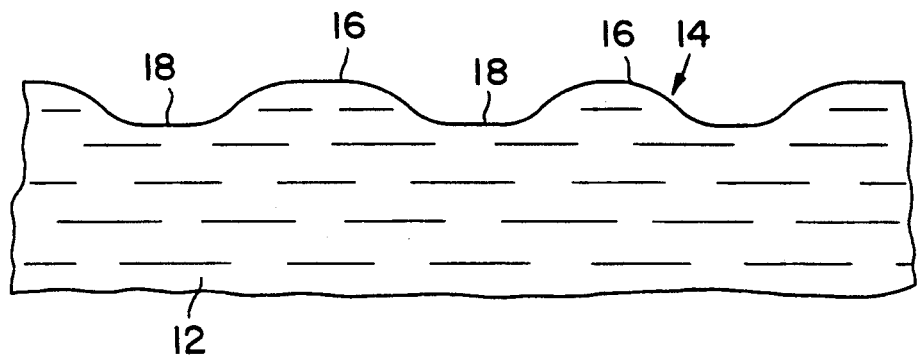
FIG. 2 is a sectional view of a surface portion of a substrate board formed by the apparatus of FIG. 1 and illustrating the manner in which the surface of the substrate board is provided with raised portions in a desired pattern.

The apparatus 10 illustrated in FIG. 1 is employed to provide an upper surface 14 of the substrate board 12 with a desired pattern. As illustrated in FIG. 2, such desired pattern includes raised portions or plateaus 16 with intervening trenches 18 extending between said raised portions 16. The raised portions 16 define a desired conductive pattern for a printed circuit board to be formed using the substrate board 12. The raised portions 16 and trenches 18 are formed at the surface 14 of the substrate board 12 using a hot press plate 20 which has an appropriate relief pattern therein.

The substrate board 12 and the hot press plate 20 are attached to lower and upper portions 22 and 24, respectively, of a press platen 26. The assembled press platen 26 is loaded in a hydraulic press (not shown) or similar compression mechanism capable of generating large compression pressures of as much as 1,000 pounds per square inch. Steam is introduced to heat the lower and upper portions 22 and 24 and the substrate board 12 and hot press plate 20 mounted thereon. The resin within the laminant of the substrate board 12 reacts to the heat and pressure, so that the upper surface 14 thereof is formed with the desired raised portions 16 and trenches 18. A thin release film 28 may be disposed on the upper surface 14 of the substrate board 12 to facilitate removal of the hot press plate 20 therefrom after the surface 14 has been deformed in the desired manner.

Figure 3A:
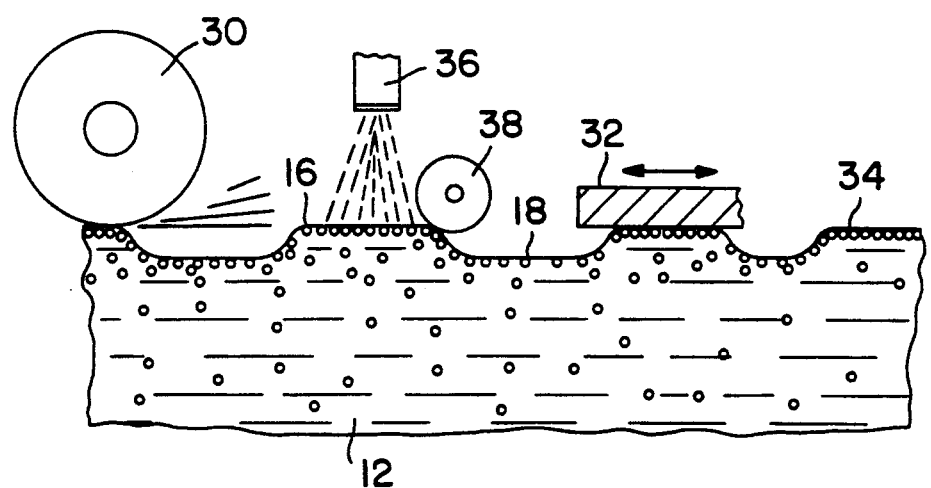
FIG. 3(a) illustrates the steps of a first method which uses the substrate board shown in FIG. 2 to produce a printed circuit board having a desired conductive pattern thereon.

FIG. 3(a) illustrates a first method for producing a printed circuit board using the substrate board 12 formed as described in connection with FIGS. 1 and 2 In the example of FIG. 3, the resin used to form the laminant of the substrate board 12 has a hard particulate filler dispersed therein. Such filler may, for example, comprise glass beads of approximately 5 mil. diameter. Such filler is provided in sufficient quantity, for example 5–10% by weight of the resin, so as to provide the surface areas of the formed substrate board 12 with a substantial concentration of the filler. The glass beads within the resin tend to migrate toward the surface areas of the substrate board 12 during the formation thereof, thereby enhancing the concentration of the filler material at such surface areas.

Following formation of the substrate board 12, the raised portions 16 at the upper surface 14 are ground so as to expose the hard particulate filler at the surface. This may be accomplished using a grinding wheel 30 as shown in FIG. 3(a).

Following grinding, conductive metal in the form of a solid, a film or powder is ground or abraded against the raised portions 16 to weld conductive material to the exposed glass beads. This can be accomplished, by way of example, by rubbing an aluminum plate 32 repeatedly over the raised portions 16 to form a continuous conductive layer 34. Alternatively, welding of conductive material on the raised portions 16 can be accomplished by directing atomized conductive metal particles onto the raised portions 16 and then working such particles onto the exposed glass beads. As shown in FIG. 3(a) atomizing apparatus 36 is employed to direct atomized aluminum particles onto the raised portions 16, following which a rubber roller 38 is rolled over the raised portions 16 to weld the aluminum particles at the raised portions 16.

Figure 3B:
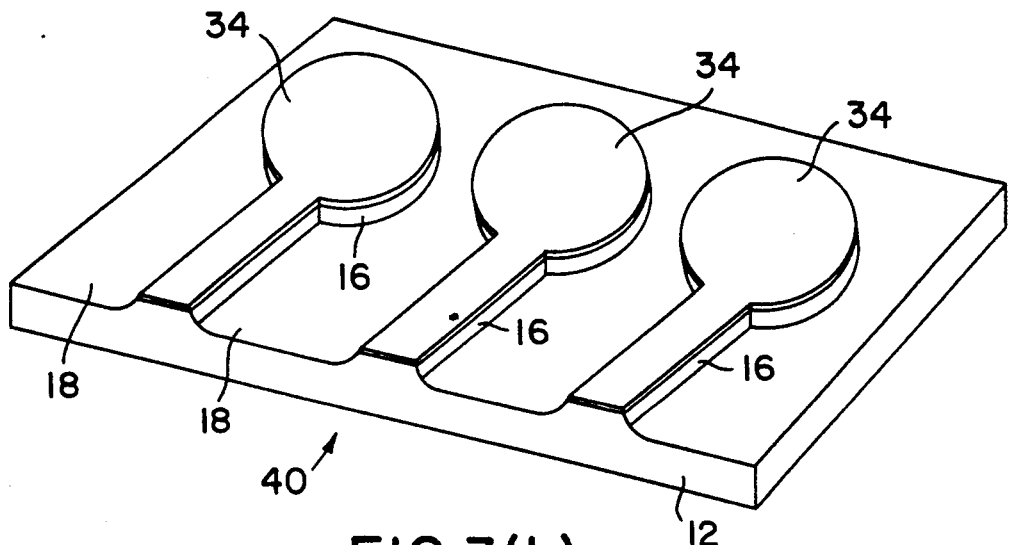
FIG. 3(b) is a perspective view of a printed circuit board produced by the method illustrated in FIG. 3(a)

FIG. 3(b) shows a printed circuit board 40 produced by the method of FIG. 3(a). As shown therein, the printed circuit board 40 has a plurality of raised portions 16 with trenches 18 disposed therebetween. The raised portions 16 are provided with the conductive layers 34 as a result of the welding process previously described. If the conductive layers 34 are for any reason found to provide less than a desirable conductive matrix, then the printed circuit board 14 can be electroplated in conventional fashion so as to plate copper or other appropriate conductive material on the conductive layers 34.

Figure 4A:
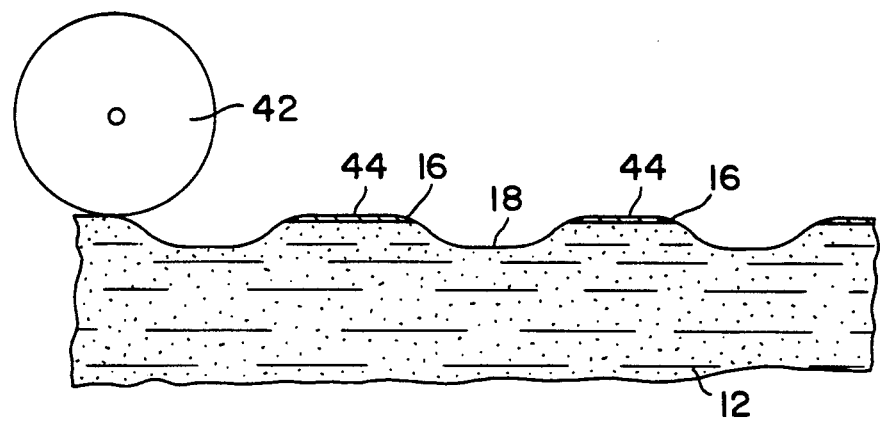
FIG. 4(a) illustrates the steps of a second method which uses the substrate board of FIG. 2 to produce a printed circuit board having a desired conductive pattern thereon.

FIG. 4(a) illustrates a second method in accordance with the invention. In the method of FIG. 4(a), the substrate board 12 is formed in the manner previously described, except that the resin system of the laminant is provided with conductive particles such as aluminum particles. Such conductive particles may, for example, have a diameter of approximately 5 mils and comprise 5–10% by weight of the resin. Following formation of the substrate board 12, the raised portions 16 are burnished such as by using a rotating roller 42. This has the effect of smearing the aluminum particles together at the surface so as to form a continuous aluminum conductor 44 at the raised portions 16. The roller 42, which comprises a chrome plated roller in the present example, burnishes the aluminum particles at the surface to form the conductor 44. The particles are forced together to form the continuous conductor 44 in spite of the oxide coatings which invariably exist on aluminum particles. The density of and oxide coatings on the remaining particles throughout the substrate board 12 are such that the particles do not form conductive regions.

Various different conductive particles can be used in accordance with the method of FIG. 4(a), with aluminum particles comprising but one example. However, particles of very high conductivity such as silver particles do not work particularly well because of the tendency of the particles to form conductive regions or layers in areas which are not burnished.

Figure 4B:
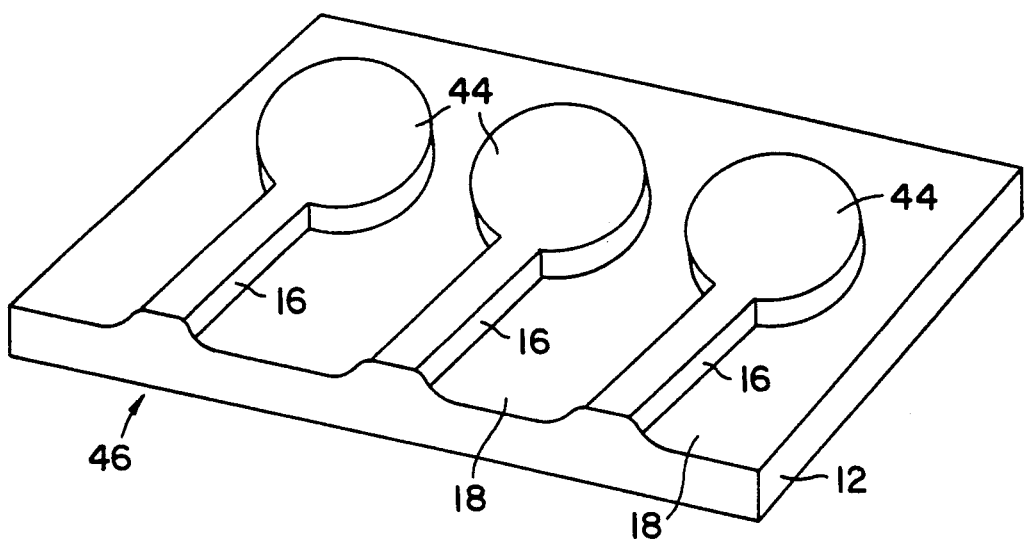
FIG. 4(b) is a perspective view of a printed circuit board produced by the method of FIG. 4(a)

FIG. 4(b) illustrates a printed circuit board 46 produced using the method illustrated in FIG. 4(a). As in the printed circuit board 40 of FIG. 3(b), the printed circuit board 46 of FIG. 4(b) is provided with a plurality of the raised portions 16 with trenches 18 existing therebetween. The raised portions 16 printed circuit board 40 of FIG. 3(b), the conductors 44 of the printed circuit board 46 can be electroplated with conductive material, where necessary.

Figure 5A:
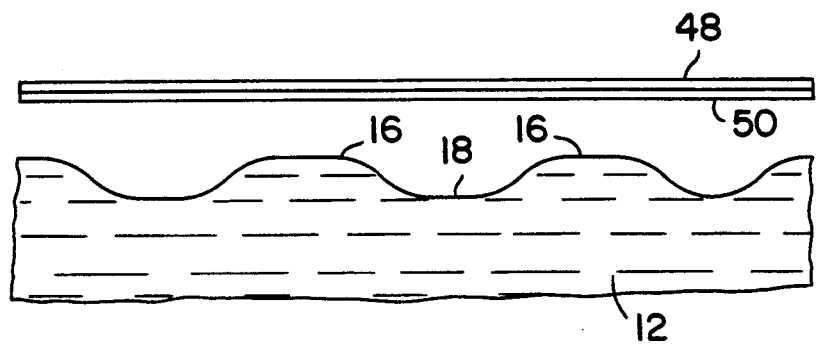
FIGS. 5(a) and 5(b) illustrate the steps of a third method which uses the substrate board of FIG. 2 to produce a printed circuit board having a desired conductive pattern thereon.
Figure 5B:
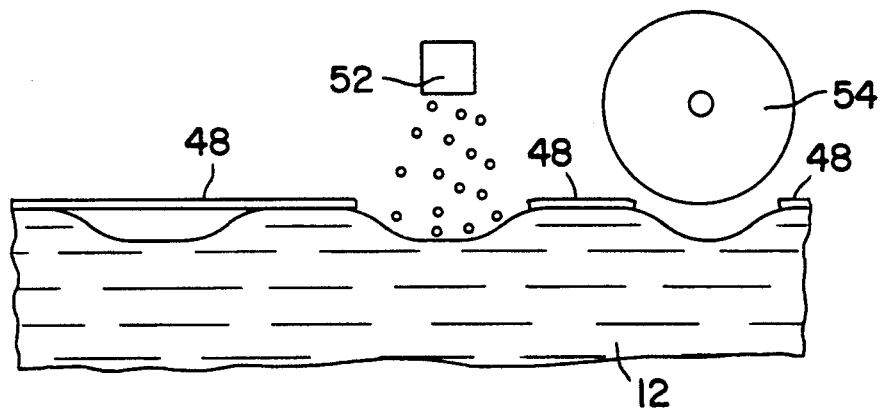

FIGS. 5(a) and 5(b) illustrate a third method in accordance with the invention. The method of FIGS. 5(a) and 5(b) produces a printed circuit board using the substrate board 12 formed in the manner described in connection with FIGS. 1 and 2. A conductive layer 48, which may comprise copper foil, has the underside surface thereof coated with a layer of adhesive 50, following which the layer 48 is applied to the raised portions 16 of the upper surface 14 of the substrate board 12. The resulting laminant may be placed in a hot press to complete the bonding process. The conductive layer 48 only adheres to the raised portions 16 and not to the trenches 18 in the upper surface 14 of the substrate board 12. FIG. 5(a) illustrates the conductive layer 48 before lamination to the raised portions 16 of the substrate board 12. Following lamination, and as shown in the left-hand portion of FIG. 5(b), the conductive layer 48 adheres to the raised portions 16 but not to the intervening trenches 18.

Portions of the conductive layer 48 above the trenches 18 are removed using one of several appropriate techniques. As illustrated in FIG. 5(b), shot peening may be used. A gun 52 is used to direct shot at high velocity onto the surface of the conductive layer 48. This results in eroding away of those portions of the conductive layer 48 disposed over the trenches 18. The portions of the conductive layer 48 disposed on the raised portions 16 remain relatively unaffected. Alternatively, the unwanted portions of the conductive layer 48 adjacent the trenches 18 may be removed using a roller such as a rubber roller 54 shown in FIG. 5(b). The roller 54 undergoes rotation relative to the substrate board 12 so as to remove the unsupported portions of the conductive layer 48 at the trenches 18.

The printed circuit board 40 of FIG. 3(b) is also illustrative of circuit boards produced using the method of FIGS. 5(a) and 5(b). Erosion or grinding away of portions of the conductive layer 48 disposed over the trenches 18 leaves conductive layers much like the layers 34 of FIG. 3(b). As in the case of the printed circuit boards of FIGS. 3(b) and 4(b), circuit boards produced by the method of FIGS. 5(a) and 5(b) can be electroplated with conductive material in the event the conductive matrix must be enhanced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of producing a printed circuit board having a conductive pattern thereon, comprising the steps of:
   processing a surface of a substrate board to provide the surface with raised portions defining a desired conductive pattern; and
   treating the raised portions of the surface of the substrate board to form conductors at the raised portions by providing the substrate board with a relatively hard particulate filler, grinding the raised portions of the surface of the substrate board to expose the relatively hard particulate filler at the raised portions of the surface, and welding conductive particles onto the exposed relatively hard particulate filler at the raised portions of the surface to form conductors.

2. A method of producing a printed circuit board as set forth in claim 1, wherein the step of welding conductive particles onto the exposed relatively hard particulate filler at the raised portions of the surface comprises rubbing a solid block of conductive metal on the exposed relatively hard particulate filler at the raised portions of the surface.

3. A method of producing a printed circuit board as set forth in claim 1, wherein the step of welding conductive particles onto the exposed relatively hard particulate filler at the raised portions of the surface comprises directing atomized conductive metal particles onto the raised portions of the surface and passing a roller over the raised portions of the surface.

4. A method of producing a printed circuit board having a conductive pattern thereon, comprising the steps of:
   processing a surface of a substrate board to provide the surface with raised portions defining a desired conductive pattern; and
   treating the raised portions of the surface of the substrate board to form conductors at the raised portions by providing the substrate board with a conductive particulate filler and burnishing the raised portions of the surface of the substrate board to form conductors from the conductive particulate filler at the raised portions of the surface.

5. A method of producing a printed circuit board, having a conductive pattern thereon, comprising the steps of:
   processing a surface of a substrate board to provide the surface with raised portions defining a desired conductive pattern; and
   treating the raised portions of the surface of the substrate board to form conductors at the raised portion by providing a conductive foil, coating a surface of the conductive foil with adhesive, laminating the conductive foil to the raised portions of the surface of the substrate board and removing portions of the conductive foil between the raised portions of the surface of the substrate board by shot peening the conductive foil.

6. A method of producing a printed circuit board having a conductive pattern thereon, comprising the steps of:
   forming a laminated substrate board using a resin having a hard particulate filler therein;
   processing a surface of the laminated substrate board to provide the surface with raised portions defining a desired conductive pattern;
   grinding the raised portions of the surface of the substrate board to expose the hard particulate filler at the raised portions of the surface; and
   welding conductive particles onto the exposed relatively hard particulate filler at the raised portions of the surface to form conductors.

7. A method of producing a printed circuit board as set forth in claim 6, wherein the laminated substrate board is formed using a resin having glass beads therein.

8. A method of producing a printed circuit board as set forth in claim 6, wherein the step of welding conductive particles onto the exposed hard particulate filler at the raised portions of the surface comprises repeatedly rubbing a block of aluminum over the raised portions of the surface.

9. A method of producing a printed circuit board as set forth in claim 6, wherein the step of welding conductive particles onto the exposed hard particulate filler at the raised portions of the surface comprises directing atomized aluminum onto the surface of the laminated substrate board and passing a roller over the raised portions of the surface.

10. A method of producing a printed circuit board having a conductive pattern thereon, comprising the steps of:
    forming a laminated substrate board using a resin having conductive particles therein;
    processing a surface of the laminated substrate board to provide the surface with raised portions defining a desired conductive pattern; and
    burnishing the raised portions of the surface of the substrate board to form conductors from the conductive particles at the raised portions of the surface.

11. A method of producing a printed circuit board as set forth in claim 10, wherein the laminated substrate board is formed using a resin having aluminum powder therein.

* * * * *